(12) United States Patent
Lv et al.

(10) Patent No.: US 8,902,312 B2
(45) Date of Patent: Dec. 2, 2014

(54) TOTAL-SKY LIGHTNING EVENT OBSERVATION SYSTEM AND METHOD

(75) Inventors: Weitao Lv, Beijing (CN); Ying Ma, Beijing (CN); Yang Zhang, Beijing (CN); Jun Yang, Beijing (CN); Wen Yao, Beijing (CN); Dong Zheng, Beijing (CN); Qing Meng, Beijing (CN); Yijun Zhang, Beijing (CN)

(73) Assignee: Chinese Academy of Meteorological Sciences, Beijing (CN)

( * ) Notice: Subject to any disclaimer, the term of this patent is extended or adjusted under 35 U.S.C. 154(b) by 0 days.

(21) Appl. No.: 13/980,515

(22) PCT Filed: Mar. 15, 2012

(86) PCT No.: PCT/CN2012/000323
§ 371 (c)(1),
(2), (4) Date: Jul. 18, 2013

(87) PCT Pub. No.: WO2012/126272
PCT Pub. Date: Sep. 27, 2012

(65) Prior Publication Data
US 2013/0286203 A1    Oct. 31, 2013

(30) Foreign Application Priority Data
Mar. 18, 2011   (CN) .......................... 2011 1 0066285

(51) Int. Cl.
*H04N 5/232* (2006.01)
*G01W 1/16* (2006.01)
*G01R 29/08* (2006.01)

(52) U.S. Cl.
CPC ............ *H04N 5/232* (2013.01); *G01R 29/0842* (2013.01); *H04N 5/23238* (2013.01); *G01W 1/16* (2013.01)
USPC .......................................................... 348/143

(58) Field of Classification Search
CPC ........... G01R 29/0842; H04N 5/23238; H04N 5/232; G01W 1/16
USPC .......................................................... 348/143
See application file for complete search history.

(56) References Cited

FOREIGN PATENT DOCUMENTS

| CN | 2710290 Y | 7/2005 |
|---|---|---|
| CN | 101545934 A | 9/2009 |

(Continued)

OTHER PUBLICATIONS

International Search Report (PCT/ISA/210) issued on Jun. 28, 2012, by the Chinese Patent Office as the International Searching Authority for International Application No. PCT/CN2012/000323.

(Continued)

*Primary Examiner* — Dave Czekaj
*Assistant Examiner* — Berteau Joisil
(74) *Attorney, Agent, or Firm* — Buchanan Ingersoll & Rooney PC

(57) ABSTRACT

A total-sky lightning event observation system and method may include a photographing device, a housing, a temperature control device, a light shielding device, a control module, a power supply module, a corona current sensor, a data acquisition device, a GPS antenna, a GPS timing module and a processing unit. The photographing device can capture total-sky digital images and transmit the images directly to the processing unit. The processing unit consecutively acquire corona current via the data acquisition device and judges whether there exists thunderstorm activity within the observed range; if there exists thunderstorm activity, the light shielding device is opened so as to enter a lightning observation mode, and the light shielding device is closed after the observation is finished so as to protect the photographing device in non-thunderstorm weather.

15 Claims, 3 Drawing Sheets

(56) References Cited

FOREIGN PATENT DOCUMENTS

| | | |
|---|---|---|
| CN | 201548622 U | 8/2010 |
| CN | 102186008 A | 9/2011 |
| CN | 202002978 U | 10/2011 |
| WO | WO 2005/017550 A2 | 2/2005 |

OTHER PUBLICATIONS

Office Action issued on Nov. 19, 2012 by the Chinese Patent Office for Application No. 201110066285.5.

Notification to Grant Patent Right for Invention issued on May 23, 2013 by the Chinese Patent Office for Application No. 201110066285.5.

TOTAL-SKY LIGHTNING EVENT OBSERVATION SYSTEM AND METHOD

TECHNICAL FIELD

The present invention relates to lightning observation, and more particularly, to a system and method for observing lightning events in total-sky range.

BACKGROUND ART

Lightning is a spectacular weather phenomenon occurring in the atmosphere, which is accompanied by transient, high current, high voltage and strong electromagnetic radiation. Lightning often leads to big disasters, resulting in not only loss of life and personal injury, but also severe economic loss in the industries of aeronautics and astronautics, national defense, power, communication, electronics, petrochemistry, transportation, forestry, etc. With rapid development of social economy, improvement of modernization level and wide application of information technology in our life, the damage extent, economic loss, and social influence caused by lightning become much greater.

Real-time lightning location data is an important basis for lightning forecasting and warning. The warning of the areas where lightning is going to take place can help us take precaution measures and reduce the damages that may be caused by lightning. In addition, lightning location data is also an important basis for disaster investigation. Detection efficiency and location accuracy of the lightning location system play a key role in effect of lightning warning, evaluation of lightning warning result and investigation of lightning disaster.

At present, many countries and regions in the world have set up cloud-to-ground lightning location networks and several total lightning location systems are also installed for monitoring lightning in real time. Some systems can even detect the development of lightning channel. However, there are so far no apparatuses that can automatically and simultaneously obtain digital images of lightning channel in total-sky range and information on the time of lightning occurrence, lightning type (cloud or cloud-to-ground lightning), and polarity of cloud-to-ground lightning in the image. Nor are there suitable apparatuses capable of observing and accumulating abundant data to thoroughly evaluate the detection efficiency and location accuracy of the prior art lightning location systems.

SUMMARY OF THE INVENTION

An object of the present invention is to provide a total-sky lightning event observation system, which can obtain total-sky digital images, automatically detect, store and display images containing lightning channel(s), and record GPS time when lightning (cloud or cloud-to-ground lightning) events occur and polarity information of cloud-to-ground lightning events in the images. The system is simple in structure and easy for installation. The observation data of the system can be used to effectively evaluate the detection efficiency and location accuracy of the prior art lightning location system.

A further object of the present invention is to provide a total-sky lightning event observation system having a light shielding device, which only automatically opens the light shielding device in thunderstorm weather for image acquisition, for the sake of effectively improving utilization efficiency and extending service life.

Another object of the present invention is to provide a total-sky lightning event observation system having a temperature control device, for automatically controlling the temperature of the working environments of some devices or modules of the system so as to enable them to work in a field environment stably and reliably in a long term.

The present invention provides a total-sky lightning event observation system, comprising a housing, a photographing device, a sensor, a data acquisition device, a processing unit and a control module. A top of the housing has an opening, at which a transparent protective cover is mounted. The photographing device is disposed in the housing and at the opening. The sensor senses a representative parameter of the thunderstorm activity and produces sensed data. The data acquisition device acquires the sensed data from the sensor. The processing unit receives the sensed data from the data acquisition device. The processing unit sets the system in a first operational mode and the data acquisition device in a first data acquiring mode when the sensed data indicates there is no thunderstorm activity within the range observed by the system, and the processing unit sets the system in a second operational mode and the data acquisition device in a second data acquiring mode when the sensed data indicates there exists thunderstorm activity within the range observed by the system. The control module is disposed within the housing. The control module receives a first instruction from the processing unit and shuts down the photographing device based on the first instruction to thereby stop photographing total-sky digital images when the sensed data indicates there is no thunderstorm activity within the range observed by the system, and the control module receives a second instruction from the processing unit and turns on the photographing device based on the second instruction to photograph total-sky digital images when the sensed data indicates there exists thunderstorm activity within the range observed by the system.

Preferably, the first operational mode is an ordinary monitoring mode, the first data acquiring mode is a low-speed real-time data acquiring mode, the second operational mode is a lightning observation mode, and the second data acquiring mode is a high-speed real-time data acquiring mode.

Preferably, the representative parameter is corona current.

Preferably, the photographing device comprises a digital camera and a fisheye lens disposed on the digital camera. The angle of view of the fisheye lens is equal to or greater than 180 degrees. The imaging plane of the photographing device is horizontally disposed. The fisheye lens is disposed above an upper surface of the housing and has a light axis pointing towards the zenith direction.

Preferably, the total-sky lightning event observation system further comprises a light shielding device disposed within the housing and located between the protective cover and the photographing device. The control module controls the light shielding device to be closed based on the first instruction in order to cover the photographing device, and the control module controls the light shielding device to be opened based on the second instruction in order not to cover the photographing device.

Preferably, the light shielding device comprises a motor, a light shielding valve unit and two limit switches. The light shielding valve unit consists of a set of spherical valves. The limit switches are used to limit the rotational position of the light shielding valve unit. In the first operational mode, the control module controls the motor to rotate based on the first instruction so as to close the light shielding valve unit for covering the photographing device. In the second operational mode, the control module controls the motor to rotate reversely based on the second instruction so as to open the light shielding valve unit for not covering the photographing device.

Preferably, the total-sky lightning event observation system further comprises a temperature control device disposed within the housing for adjusting ambient temperature in the housing. The control module is coupled to and controls the temperature control device.

Preferably, the total-sky lightning event observation system further comprises a power supply module disposed within the housing and coupled to the photographing device, the control module, the light shielding device and the temperature control device for supplying power thereto.

Preferably, the total-sky lightning event observation system further comprises a GPS antenna and a GPS timing module. The GPS antenna is coupled to the GPS timing module which is coupled to the processing unit. The GPS timing module is used to time the processing unit periodically and obtain accurate trigger time information in response to external trigger signals and send the same to the processing unit, with a time precision thereof required to be better than 1 µs.

Preferably, the processing unit is a computer, and the data acquisition device is a data acquisition card.

The present invention also provides a total-sky lightning event observation method, comprising the steps of: providing a total-sky lightning event observation system including a photographing device, a sensor and a data acquisition device; utilizing the data acquisition device to acquire sensed data of the thunderstorm activity from the sensor in a low-speed real-time data acquiring mode; judging whether there exists thunderstorm activity within the range observed by the system based on the sensed data; setting the system in an ordinary monitoring mode and the data acquisition device in a low-speed real-time data acquiring mode, and shutting down the photographing device to stop photographing total-sky digital images when there is no thunderstorm activity in the range observed by the system; setting the system in a lightning observing mode and the data acquisition device in a high-speed real-time data acquiring mode, and turning on the photographing device to observe lightning events in total-sky range when there exists thunderstorm activity in the range observed by the system.

The present invention has the following advantages and beneficial effects: 1. observing lightning events in total-sky range, obtaining images of lightning channel(s), and providing GPS time when the lightning event occurs, lightning type (cloud or cloud-to-ground lightning) and polarity of cloud-to-ground lightning in each image; 2. evaluating detection efficiency and location accuracy of the prior art lightning location system; 3. monitoring corona current waveform in real time, automatically opening the light shielding device and turning on the photographing device only when there exists thunderstorm activity in the observed range, and automatically controlling the ambient working temperature thereof to effectively improve utilization efficiency and extend service life of the apparatus, and to ensure operation thereof in a field environment stably and reliably in a long term; and 4. having simple structure, easy installation and low cost.

DETAILED DESCRIPTION OF THE PREFERRED EMBODIMENTS

A total-sky lightning event observation system of the present invention will be explained hereinafter with reference to the accompanied drawings and the specific embodiments.

Figure 1:
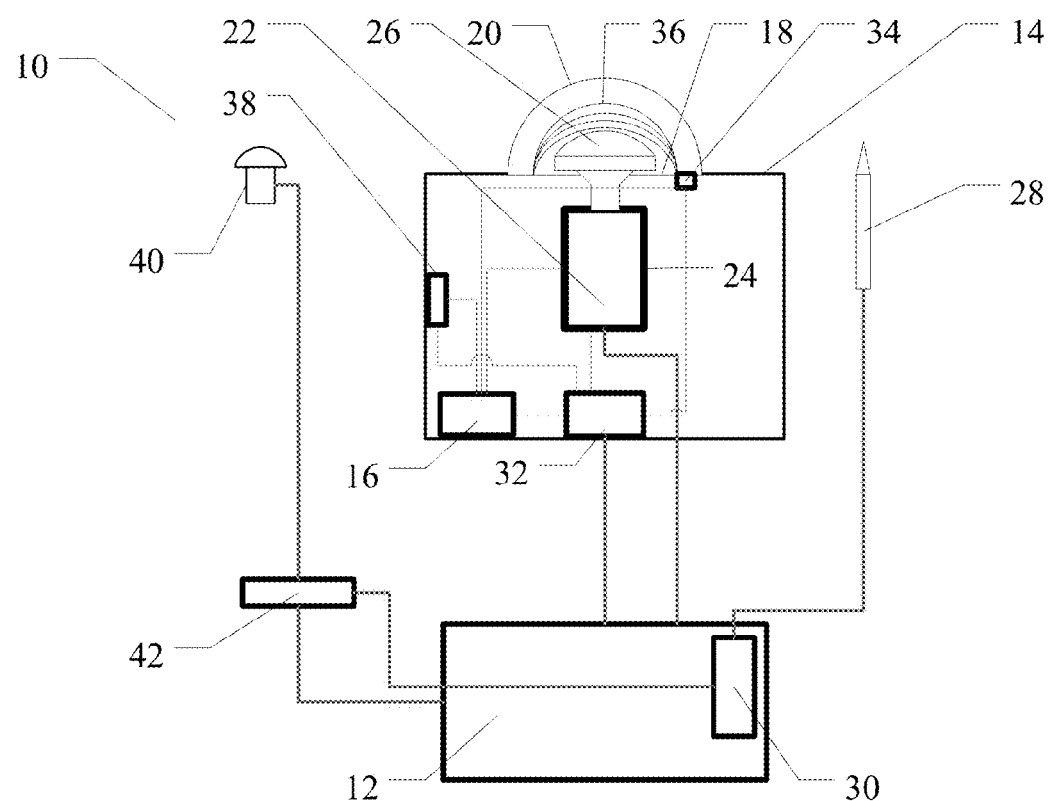
FIG. 1 is a schematic view of a total-sky lightning event observation system according to the present invention.

In one aspect of the present invention, FIG. 1 schematically shows a total-sky lightning event observation system 10 in accordance with the present invention, which includes a processing unit 12, a housing 14 and a power supply module 16.

The processing unit 12 is used to process data and control operations of some devices or modules of the system 10. In a preferred embodiment, the processing unit 12 may be a computer and may include a clock (not shown).

The housing 14 may be a protective case with a circular opening 18 on a top upper surface. A transparent protective cover 20 is mounted at the opening 18. The term "transparent" used herein means non-hindrance in terms of lightning event photographing, and does not mean transparency to light having a certain wavelength or wavelength range. Preferably, the opening 18 is a circular opening. Preferably, the protective cover 20 is semi-spherical. Preferably, the protective cover 20 is made of hydrophobic material, or sprayed with a hydrophobic coating on the surface. In a preferred embodiment, the protective cover 20 is an acrylic semi-spherical protective cover coated with a hydrophobic coating. Preferably, the housing 14 may be composed of a heat insulation material sandwiched by two layers of metal, or may be directly made of a rigid material having a heat insulating and water-proof performance. Preferably, the housing 14 may be shaped as a square cavity or a columnar cavity, or in any other suitable shape. In a preferred embodiment, the housing 14 may be composed of a heat insulation material sandwiched by two layers of metal, and be shaped as a square cavity.

The power supply module 16 is used to supply power to some devices or modules of the total-sky lightning event observation system 10, as will be further explained in detail. The power supply module 16 may be disposed in the housing 14.

The total-sky lightning event observation system 10 further comprises a photographing device 22 which may be disposed in the housing 14 and located at the opening 18. The photographing device 22 is adapted to photograph total-sky digital images. In a preferred embodiment, the photographing device 22 comprises a digital camera 24 and a fisheye lens 26 disposed on the digital camera 24 with an angle of view equal to or greater than 180 degrees. The digital camera 24 is used to photograph images and directly output digital signals of the photographed images, and is directly connected with the processing unit 12 by data lines without an image acquisition card to send the photographed images to the processing unit 12. In a preferred embodiment, the digital camera 24 may be a digital camera in visible light waveband or infrared waveband, and may use a USB, 1394, Camera Link or GigE interface, or any other interface that is known in the art. If a digital camera 24 with USB or 1394 interface is used, then the digital camera 24 may be directly powered by the connecting line connected to the processing unit 12; if a digital camera 24 with Camera Link or GigE interface is used, then the digital camera 24 may be powered by the power supply module 16. As to the digital camera 24 with Camera Link interface, the processing unit 12 may be mounted with a Camera Link digital image acquiring and processing card (not shown). In a preferred embodiment, a digital camera 24 with 1394 interface and a fisheye lens 26 with an angle of view of 185 degrees may be employed, and the digital camera 24 and the processing unit 12 are connected by 1394 connecting line for transmitting digital images to the processing unit 12. In a preferred embodiment, the imaging plane of the digital camera 24 is horizontally disposed. The fisheye lens 26 is disposed upwards and has a light axis pointing towards the zenith direction. The fisheye lens 26 is disposed higher than the upper surface of the housing 14 to achieve total-sky imaging above the mounting plane. Preferably, the fisheye lens 26 is slightly higher than the upper surface of the housing 14 as long as the total-sky imaging can be accomplished. In a preferred embodiment, the top of the fisheye lens 26 is 10 mm higher than the upper surface 10 of the housing 14.

The total-sky lightning event observation system 10 further comprises a sensor 28 for sensing a representative parameter of the thunderstorm activity in the observed range and for producing sensed data. In a preferred embodiment, the representative parameter is corona current, and the sensor 28 is a corona current sensor for sensing the corona current. It should be understood that the representative parameter may be any parameter known in the art representing the thunderstorm activity, for instance, electric field change, magnetic field change and light radiation intensity. The sensor 28 may be any sensor known in the art capable of sensing the representative parameter, for instance, a fast/slow electric field change antenna, a magnetic antenna and a photodiode.

The total-sky lightning event observation system 10 further comprises a data acquisition device 30 for acquiring sensed data of the representative parameter from the sensor 28. In a preferred embodiment, the data acquisition device 30 is a data acquisition card mounted in a PCI slot in the processing unit 12 (a computer in this embodiment) to transmit data via a PCI bus. The data acquisition card has at least one input channel and at least one output channel. The highest sampling rate is no less than 1M times per second. The output channel has a trigger output function. The input channel is coupled to the sensor 28. In a preferred embodiment, the output channel having a trigger output function is coupled to a GPS timing module 42 (which will be further described in detail).

The total-sky lightning event observation system 10 further comprises a control module 32 for controlling some devices or modules of the total-sky lightning event observation system 10. The control module 32 is disposed in the housing 14. In a preferred embodiment, the control module 32 is coupled to the photographing device 22, and receives instructions from the processing unit 12 through, for example, a serial interface so as to control the photographing device 22. Preferably, the control module 32 may be a PLC (a programmable controller) or a single chip control board. In a preferred embodiment, the control module 32 is a PLC that is coupled to the processing unit 12 through, for instance, a serial interface.

In a preferred embodiment, the processing unit 12 determines the operational mode of the total-sky lightning event observation system 10 and the data acquiring mode of the data acquisition device 30 based on the sensed data collected from the sensor 28 by the acquisition device 30. When the sensed data indicates there is no thunderstorm activity within the range observed by the total-sky lightning event observation system 10, the processing unit 12 sets the system 10 in a first operational mode and the data acquisition device 30 in a first data acquiring mode, and the control module 32 receives a first instruction from the processing unit 12 and shuts down the photographing device 22 based on the first instruction to stop photographing. When the sensed data indicates there exists thunderstorm activity within the range observed by the total-sky lightning event observation system 10, the processing unit 12 sets the system 10 in a second operational mode and the data acquisition device 30 in a second data acquiring mode, and the control module 32 receives a second instruction from the processing unit 12 and turns on the photographing device 22 based on the second instruction to start photographing.

"The observed range" used herein refers to a range with a radius of 15 kilometers by taking the total-sky lightning event observation system 10 as a center.

In a preferred embodiment, the first operational mode is an ordinary monitoring mode, the first data acquiring mode is a low-speed real-time data acquiring mode, the second operational mode is a lightning observation mode, and the second data acquiring mode is a high-speed real-time data acquiring mode. In the lightning observation mode, the processing unit 12 consecutively obtains images from the photographing device 22 in real time and detects in real time whether there is/are lightning channel(s) in the obtained images. In the ordinary monitoring mode, the photographing device 22 is shut down, and the processing unit 12 analyzes in real time the sensed data collected from the sensor 28 by the data acquisition device 30, thereby judging whether there exists thunderstorm activity in the observed range. If there exists thunderstorm activity, then the processing unit 12, as stated above, changes the system 10 into the lightning observation mode and the data acquisition device 30 into the high-speed real-time data acquiring mode, and meanwhile the photographing device 22 is turned on to be in a consecutive acquiring state. If there is no thunderstorm activity, the processing unit 12 keeps the system 10 in the ordinary monitoring mode and the data acquisition device 30 in the low-speed real-time data acquiring mode.

The term "high speed" used herein refers to the sampling rate no less than 1M times per second, and the terms "low speed" used herein refers to the sampling rate no more than 10 times per second.

In a preferred embodiment, the total-sky lightning event observation system 10 may further comprises a light shielding device 34. The control module 32 is coupled to the light shielding device 34, and receives instructions from the processing unit 12 through, for example, a serial interface so as to control the light shielding device 34. The light shielding device 34 may be disposed in the housing 14 between the protective cover 20 and the photographing device 22. The control module 32 closes the light shielding device 34 based on the first instruction in order to cover the photographing device 22, and the control module 32 opens the light shielding device 34 based on the second instruction in order not to cover the photographing device 22. In a particularly preferred embodiment, the light shielding device 34 comprises a motor (not shown), a light shielding valve unit 36 and two limit switches (not shown), wherein the limit switches may be any element or configuration known in the art for limiting rotational position of the light shielding valve unit 36. In the first operational mode, the control module 32 controls the motor to rotate based on the first instruction so as to close the light shielding valve unit 36 for covering the photographing device 22. In the second operational mode, the control module 32 controls the motor to rotate reversely based on the second instruction so as to open the light shielding valve unit 36 for not covering the photographing device 22.

In a preferred embodiment, the total-sky lightning event observation system 10 may further comprises a temperature control device 38. Preferably, the control module 32 is coupled to the temperature control device 38, and receives instructions from the processing unit 12 through, for example, a serial interface to control the temperature control device 38. Preferably, the temperature control device 38 may be disposed in the housing 14 and used to adjust ambient temperature in the housing 14. Especially preferably, the temperature control device 38 may be disposed in the housing 14 and used to adjust the ambient working temperature of the photographing device 22 for meeting normal operational requirements of the photographing device 22, so as to enable it to work in a severe field environment stably and reliably in a long term.

In a preferred embodiment, the total-sky lightning event observation system 10 may further comprises a GPS antenna 40 and a GPS timing module 42. The GPS antenna 40 may be coupled to the GPS timing module 42 which may be coupled to the processing unit 12. The GPS timing module 42 is used to time the processing unit 12 periodically and obtain accurate trigger time information in response to external trigger signals and send the same to the processing unit 12, with a time precision thereof required to be better than 1 μs.

In a preferred embodiment, the power supply module 16 may be coupled to the photographing device 22, the control module 32, the light shielding device 34 and the temperature control device 38 and supply power thereto.

In a preferred embodiment, the housing 14, the sensor 28 and the GPS antenna 40 are all located outdoors, and the GPS timing module 42 and the processing unit 12 are located indoors.

In a preferred embodiment, the processing unit 12 is coupled to the photographing device 22, the sensor 28, the control module 32 and the GPS timing module 42 to accomplish the following tasks through data collection and instruction transmission: acquiring the sensed data of the representative parameter (particularly, the corona current) of the thunderstorm activity from the sensor 28; sending instructions to the control module 28 to control the photographing device 22 and the light shielding device 34; acquiring, storing and displaying images taken by the photographing device 22, and detecting whether there is/are lightning channel(s) in the images; obtaining GPS time from the GPS timing module 42 periodically and providing the timing; obtaining and recording waveform data showing rapid and large magnitude change of the sensed data, as well as time information triggered and output by the data acquisition device 30, and in turn judging lightning type (cloud or cloud-to-ground lightning) and polarity of cloud-to-ground lightning.

Figure 2:
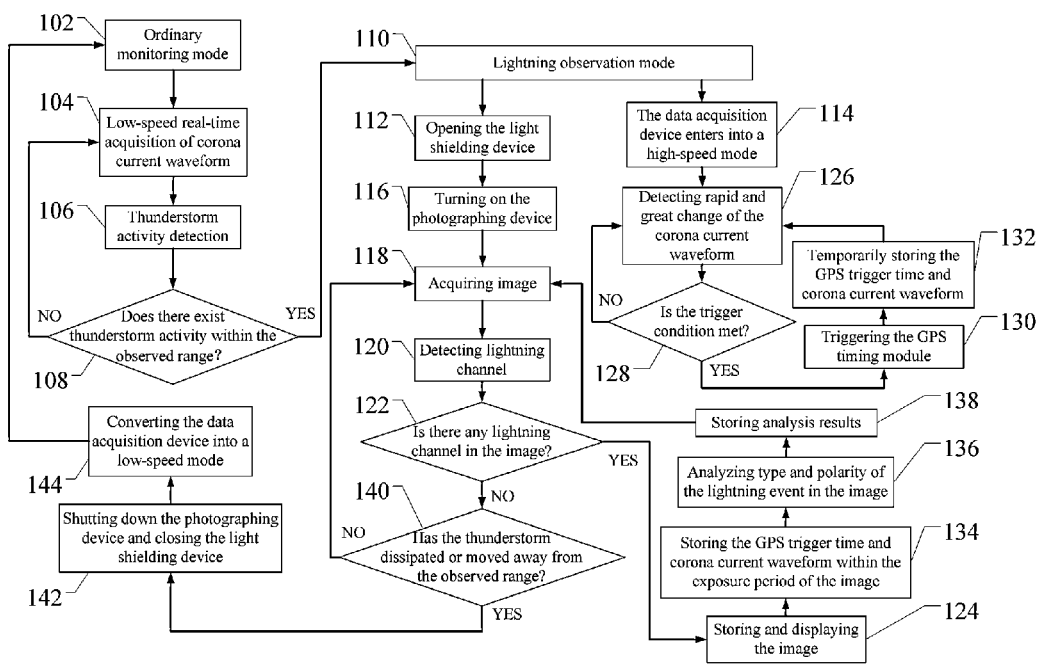
FIG. 2 is a flow chart of a total-sky lightning event observation system according to the present invention.

Now refer to FIG. 2, which is a flow chart showing the flow 100 of the total-sky lightning event observation system 10 according to one embodiment of the present invention. As stated above, the system 10 may have two operational modes: the ordinary monitoring mode and the lightning observation mode.

In step 102, the system 10 is in the ordinary monitoring mode, wherein the photographing device 22 is shut down (not photographing) and the data acquisition device 30 is in the low-speed real-time data acquiring mode (for instance, 10 or 100 times of sampling per second). In step 104, the data acquisition device 30, for instance, acquires data of the corona current at a low speed in real time. In step 106, the processing unit 12 analyzes the acquired corona current data in real time, and in step 108, it is judged whether there exists thunderstorm activity in the observed range. If there exists thunderstorm activity, then the system 10 is changed into the lightning observation mode in step 110. If there is no thunderstorm activity, then return to step 104.

If the system 10 is in the lightning observation mode, then the photographing device 22 in this mode is in working state (photographing state), and the data acquisition device 30 is in the high-speed real-time data acquiring mode. To be specific, the light shielding device 34 is opened in step 112, and the data acquisition device 30 is set in the high-speed real-time data acquiring mode in step 114. Then, the photographing device 22 is turned on in step 116. In step 118, the processing unit 12 enables the photographing device 22 to consecutively obtain total-sky digital images in real time. The processing unit 12 detects in real time the lightning channel(s) in the collected images in step 120 and judges whether there is/are lightning channel(s) in step 122. If there is/are lightning channel(s), then the images are stored and displayed in step 124; and if there is no lightning channel, then continue to step 140. Meanwhile, the processing unit 12 monitors changes of the corona current waveform at a high speed and in real time in step 126 and judges whether a trigger condition is met in step 128. If the corona current exhibits rapidly and greatly change (i.e., the trigger condition is met), then in step 130, the data acquisition device 30 outputs the trigger signals to the GPS timing module 42, and the GPS timing module 42 transmits the triggered time information to the processing unit 12 through a serial interface, and then the processing unit 12 temporarily stores the GPS trigger time and corresponding corona current waveform in step 132. If the trigger condition is not met, then return to step 126. As to each image detected to has lightning channel(s), the processing unit 12 records in step 134 the waveform and the trigger time of all the greatly corona current changes within the exposure period corresponding to said image, analyzes in step 136 type of lightning event (cloud or cloud-to-ground lightning) and polarity of cloud-to-ground lightning in the image in combination with the image of the lightning channel(s) and the corona current waveform, and then stores in step 138 the analysis result. In step 140, it is judged whether the thunderstorm has dissipated or moved away from the observed range. If the lasting time that no lightning channel is detected in the images exceeds a preset threshold (for instance, 15 minutes) and the corona current data meet criterion for non-thunderstorm weather, then it is deemed that the thunderstorm has dissipated or moved away from the observed range, which means that currently there is already no thunderstorm activity within the observed range. Then, the photographing device 22 is shut down and the light shielding device 34 is closed in step 142, and the data acquisition device 30 is changed into the low-speed real-time data acquiring mode in step 144. Then return to step 102, and the system 10 is changed into the ordinary monitoring mode. If it is judged in step 140 that the thunderstorm does not dissipate and does not move away from the observed range, which means there still exists thunderstorm activity within the observed range, then return to step 118.

No matter in the ordinary monitoring mode or the lightning observation mode, the GPS timing module 42 provides GPS timing to the processing unit 12 periodically (for instance, every ten minutes) to ensure that the clock accuracy of the processing unit 12 is better than 1 ms.

In a preferred embodiment, image acquisition and lightning channel detection may be processed by parallel algorithms. So do the real-time corona current waveform acquisition and analysis. In this case, the requirement of real-time data acquiring and processing can be satisfied.

The total-sky lightning event observation system 10 of the present invention can automatically obtain total-sky images of cloud lightning and cloud-to-ground lightning channel(s) and record the GPS time of the occurrence of the lightning event, as well as information on polarity of cloud-to-ground lightning under the control of the processing unit 12. As to cloud-to-ground lightning event, the image of the lightning channel can provide information on azimuth angle of the ground strike point location thereof with respect to the observation position. Accurate positional information of the strike point can be obtained from the image in some occasions, for instance, a cloud-to-ground lightning occurs on the top of a structure that is visible or on a hill where the strike point is visible. The detection efficiency and location accuracy of the prior art cloud-to-ground lightning location system can be evaluated in conjunction with the image, polarity and the GPS time of the occurrence cloud-to-ground lightning. No matter it is a cloud lightning or a cloud-to-ground lightning, the image of the lightning channel can provide information on azimuth angle and elevation angle of the lightning channel at different positions, and can evaluate the observation result of the lightning radiation source location system.

Furthermore, the total-sky lightning event observation system 10 of the present invention is also adapted to monitor lightning activities in a designated area. The total-sky lightning event observation system 10 of the present invention can automatically shield the photographing device against light in non-thunderstorm weather, and automatically control the temperature of the working environment of the photographing device, so as to enable it to work in a field environment stably and reliably in a long term.

In an application of the lightning observation system of the present invention, two sets of lightning observation system may be set up in one region but spaced apart by a certain distance (for instance, 2 km). The lightning channel images obtained by these two sets of total-sky lightning event observation systems can be used to reconstruct the three-dimensional channel of the lightning, so as to evaluate the result of the three-dimensional lightning detection system.

Figure 3:
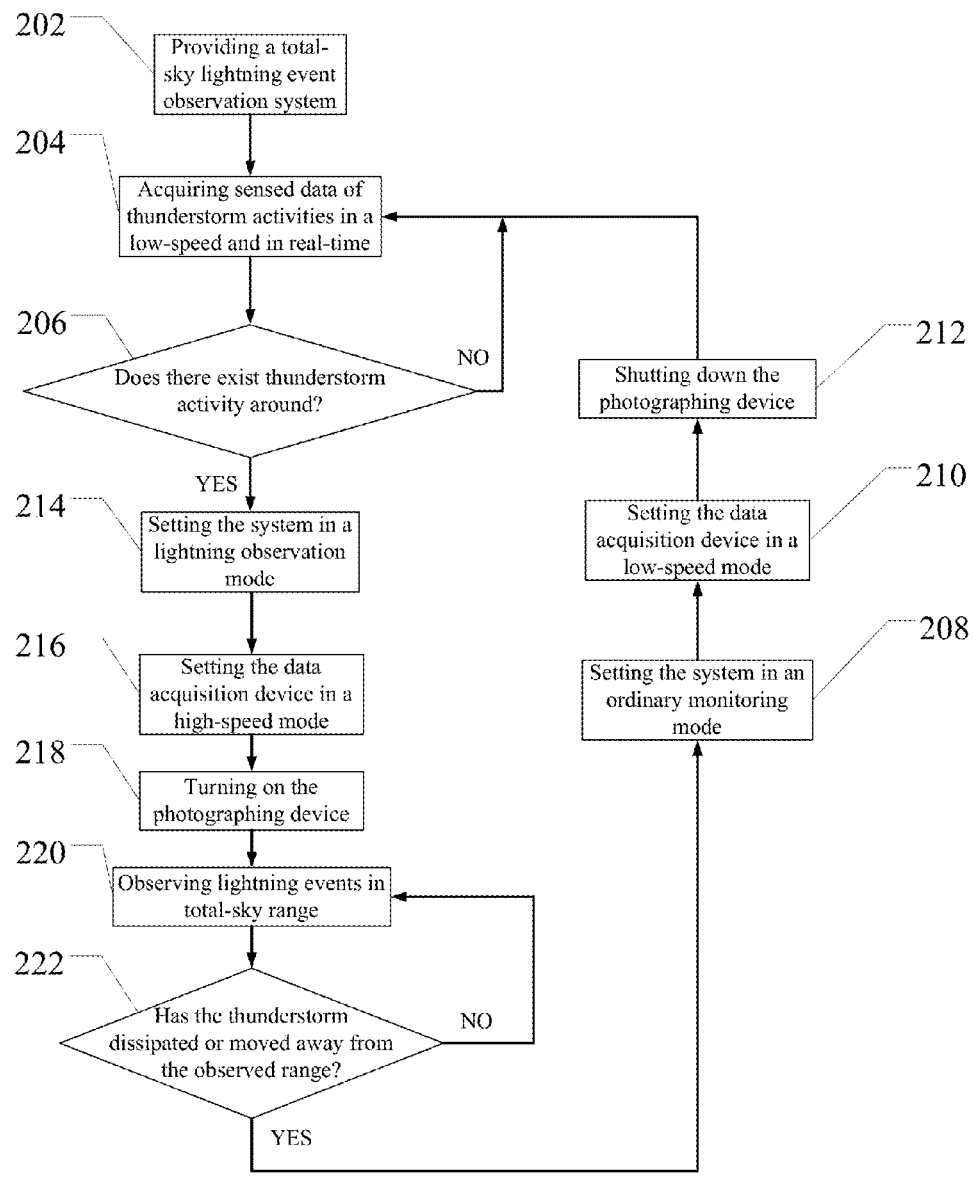
FIG. 3 is a flow chart of a lightning event observation method according to the present invention.

As shown in FIG. 3, the present invention also discloses a lightning event observation method 200. Hereinafter, the lightning event observation method 200 according to the present invention will be described in detail. In step 202, a total-sky lightning event observation system is provided, which includes a photographing device, a sensor and a data acquisition device. In step 204, the data acquisition device is utilized to acquire sensed data of the thunderstorm activity from the sensor in a low-speed real-time data acquiring mode. In step 206, it is judged whether there exists thunderstorm activity in the range observed by the system based on the sensed data. If there is no thunderstorm activity in the range observed by the system, return to step 204. When the system judges there exists thunderstorm activity within the observed range, the system is set in a lightning observation mode in step 214. The data acquisition device is set in a high-speed real-time data acquiring mode in step 216 and the photographing device is turned on in step 218, so as to observe the lightning events in total-sky range in step 220. Then, it is judged whether the thunderstorm has dissipated or moved away from the observed range in step 222. If the thunderstorm does not dissipate and does not move away from the observed range which means there still exists thunderstorm activity within the observed range, then return to step 220. If the thunderstorm has dissipated or moved away from the observed range which means currently there is already no thunderstorm activity within the observed range, then the system is set in an ordinary monitoring mode in step 208, and the data acquisition device is set in the low-speed real-time data acquiring mode in step 210, and the photographing device is shut down in step 212, thereby stop photographing total-sky digital images. Then, return to step 204.

The term "coupled" used herein is not limited to direct connection, but also includes various indirect connections known in the art.

It can be appreciated by those skilled in the art from the previous detailed description that the broad teaching of the present disclosure can be implemented in various forms. Even though the present disclosure includes specific examples, the real scope of the present disclosure should not be limited thereto, as other modifications, variations and replacements can be understood by those skilled in the art after studying the drawings, specification and the attached claims.

The invention claimed is:

1. A total-sky lightning event observation system, comprising:
   a housing, a top of which has an opening, at which a transparent protective cover is mounted;
   a photographing device disposed in the housing and at the opening;
   a sensor for sensing a representative parameter of the thunderstorm activity and producing sensed data;
   a data acquisition device for acquiring the sensed data from the sensor;
   a processing unit for receiving the sensed data from the data acquisition device, the processing unit setting the system in a first operational mode and the data acquisition device in a first data acquiring mode when the sensed data indicates there is no thunderstorm activity within a range observed by the system, and the processing unit setting the system in a second operational mode and the data acquisition device in a second data acquiring mode when the sensed data indicates there exists thunderstorm activity within the range observed by the system; and
   a control module disposed within the housing, the control module receiving a first instruction from the processing unit and shutting down the photographing device based on the first instruction to thereby stop photographing total-sky digital images when the sensed data indicates there is no thunderstorm activity within the range observed by the system, and the control module receiving a second instruction from the processing unit and turning on the photographing device based on the second instruction to photograph total-sky digital images when the sensed data indicates there exists thunderstorm activity within the range observed by the system.

2. The total-sky lightning event observation system according to claim 1, wherein the first operational mode is an ordinary monitoring mode, the first data acquiring mode is a low-speed real-time data acquiring mode, the second operational mode is a lightning observation mode, and the second data acquiring mode is a high-speed real-time data acquiring mode.

3. The total-sky lightning event observation system according to claim 1, wherein the representative parameter is corona current.

4. The total-sky lightning event observation system according to claim 1, wherein the photographing device comprises a digital camera and a fisheye lens disposed on the digital camera, the angle of view of a fisheye lens is equal to or greater than 180 degrees, the imaging plane of the photographing device is horizontally disposed, and the fisheye lens is disposed above an upper surface of the housing and has a light axis pointing towards the zenith direction.

5. The total-sky lightning event observation system according to claim 1, further comprising a light shielding device, wherein the light shielding device is disposed within the housing and located between the protective cover and the photographing device, and wherein the control module controls the light shielding device to be closed based on the first instruction in order to cover the photographing device, and the control module controls the light shielding device to be opened based on the second instruction in order not to cover the photographing device.

6. The total-sky lightning event observation system according to claim 5, wherein the light shielding device comprises a motor, a light shielding valve unit and two limit switches, the limit switches are used to limit the rotational position of the light shielding valve unit, and in the first operational mode, the control module controls the motor to rotate based on the first instruction so as to close the light shielding valve unit for covering the photographing device, and in the second operational mode, the control module controls the motor to rotate reversely based on the second instruction so as to open the light shielding valve unit for not covering the photographing device.

7. The total-sky lightning event observation system according to claim 6, further comprising a temperature control device, wherein the temperature control device is disposed within the housing for adjusting ambient temperature in the housing, and the control module is coupled to and controls the temperature control device.

8. The total-sky lightning event observation system according to claim 7, further comprising a power supply module, wherein the power supply module is disposed within the housing and coupled to the photographing device, the control module, the light shielding device and the temperature control device for supplying power thereto.

9. The total-sky lightning event observation system according to claim 1, further comprising a GPS antenna and a GPS timing module, wherein the GPS antenna is coupled to the GPS timing module which is coupled to the processing unit, the GPS timing module is used to time the processing unit periodically and obtain accurate trigger time information in response to external trigger signals and send the same to the processing unit, with a time precision thereof required to be better than 1 µs.

10. The total-sky lightning event observation system according to claim 1, wherein the processing unit is a computer, and the data acquisition device is a data acquisition card.

11. A total-sky lightning event observation method, comprising the steps of:
providing a total-sky lightning event observation system including a photographing device, a sensor and a data acquisition device;
utilizing the data acquisition device to acquire sensed data of the thunderstorm activity from the sensor in a low-speed real-time data acquiring mode;
judging whether there exists thunderstorm activity within the range observed by the system based on the sensed data;
setting the system in an ordinary monitoring mode and the data acquisition device in the low-speed real-time data acquiring mode, and shutting down the photographing device to stop photographing total-sky digital images, when there is no thunderstorm activity in the range observed by the system; and
setting the system in a lightning observing mode and the data acquisition device in the high-speed real-time data acquiring mode, and turning on the photographing device to observe lightning events in total-sky range, when there exists thunderstorm activity in the range observed by the system.

12. The total-sky lightning event observation system according to claim 4, further comprising a light shielding device, wherein the light shielding device is disposed within the housing and located between the protective cover and the photographing device, and wherein the control module controls the light shielding device to be closed based on the first instruction in order to cover the photographing device, and the control module controls the light shielding device to be opened based on the second instruction in order not to cover the photographing device.

13. The total-sky lightning event observation system according to claim 12, wherein the light shielding device comprises a motor, a light shielding valve unit and two limit switches, the limit switches are used to limit the rotational position of the light shielding valve unit, and in the first operational mode, the control module controls the motor to rotate based on the first instruction so as to close the light shielding valve unit for covering the photographing device, and in the second operational mode, the control module controls the motor to rotate reversely based on the second instruction so as to open the light shielding valve unit for not covering the photographing device.

14. The total-sky lightning event observation system according to claim 13, further comprising a temperature control device, wherein the temperature control device is disposed within the housing for adjusting ambient temperature in the housing, and the control module is coupled to and controls the temperature control device.

15. The total-sky lightning event observation system according to claim 14, further comprising a power supply module, wherein the power supply module is disposed within the housing and coupled to the photographing device, the control module, the light shielding device and the temperature control device for supplying power thereto.

* * * * *